United States Patent [19]

Mori et al.

[11] Patent Number: 5,208,185
[45] Date of Patent: May 4, 1993

[54] PROCESS FOR DIFFUSING BORON INTO SEMICONDUCTOR WAFERS

[75] Inventors: Yoshiyuki Mori, Takasaki; Yukiharu Kitazawa, Annaka; Masahide Kojima, Takasaki; Tomoyuki Sakai, Annaka; Eiichi Nishijo, Takasaki; Nobuhiro Tsuda, Annaka; Tadayuki Ebe, Urawa, all of Japan

[73] Assignee: Shin-Etsu Handotai Co., Ltd., Tokyo, Japan

[21] Appl. No.: 852,613

[22] Filed: Mar. 17, 1992

[30] Foreign Application Priority Data

Mar. 20, 1991 [JP] Japan ............... 3-081710

[51] Int. Cl.$^5$ .......................... H01L 21/223
[52] U.S. Cl. ............... 437/168; 148/DIG. 34
[58] Field of Search ........... 437/168, 169, 987, 950, 437/954, 955, 949; 148/DIG. 30, DIG. 34, DIG. 36

[56] References Cited

U.S. PATENT DOCUMENTS

| | | | |
|---|---|---|---|
| 3,205,102 | 9/1965 | McCaldin | 437/168 |
| 3,530,016 | 9/1970 | Joseph | 437/168 |
| 3,907,618 | 9/1975 | Rapp | 437/168 |
| 3,928,096 | 12/1975 | Vergano et al. | 437/168 |

FOREIGN PATENT DOCUMENTS

| | | | |
|---|---|---|---|
| 3028729 | 6/1983 | Japan | 437/168 |
| 2197125 | 5/1988 | United Kingdom | 437/168 |

OTHER PUBLICATIONS

Wolf, S., et al., *Silicon Processing for the UCSI Era*, vol. 1, p. 266, 1986.
Ghandhi, S., *VLSI Fabrication Principles*, Silicon and Gallium Arsenide, p. 166, 1983.

*Primary Examiner*—George Fourson
*Attorney, Agent, or Firm*—Nikaido, Marmelstein, Murray & Oram

[57] ABSTRACT

In a boron diffusion process, a multiplicity of semiconductor wafers and pyrolytic boron nitride dopant disks are placed in a diffusion tube kept in an inert atmosphere at a high temperature, and boron diffusion is performed with hydrogen injection, the initial concentration of hydrogen in the diffusion tube being a very low range of 0.05% by volume at maximum. The result is that it is possible to improve dispersion of sheet resistivity ($\rho$s) of the silicon wafer surface remarkably and to suppress occurrence of lattice defects.

11 Claims, 1 Drawing Sheet

PROCESS FOR DIFFUSING BORON INTO SEMICONDUCTOR WAFERS

BACKGROUND OF THE INVENTION

1. Field of the Invention

This invention relates to a process of diffusing boron into semiconductor wafers with both low dispersion of sheet resistivity and low generation of lattice defects.

2. Description of the Prior Art

The use of boron nitride (BN) is known as a boron source in the diffusion of boron into transistor base regions. There is disclosed a process of diffusing boron into semiconductor wafers, e.g., silicon wafers, by using a sintered wafer-like disk of BN powder wherein the sintered BN is oxidized to $B_2O_3$ ($2BN + 3/2O_2 \rightarrow B_2O_3 + N_2$), the boron oxide ($B_2O_3$) being an active boron dopant (Japanese Patent Publication No. 28722/1968). The BN source contains, in the starting BN powder, impurities such as sodium phosphate, sodium oxide, iron oxide, calcium oxide or carbon, which originate in the production thereof. Further, since boric acid anhydride, calcium oxide, aluminum oxide, sodium oxide, aluminum phosphate or silicon dioxide ($SiO_2$) are used as a binder for sintering, such binders would remain in the BN source.

To this end, one proposal has been made in which pyrolytic boron nitride (PBN) is used as a substitution for the sintered BN in an attempt to eliminate harmful effects caused by the above-mentioned impurities and binders (Japanese Patent Laid-Open Publication No. 101026/1987).

Another proposal has been made in which hydrogen injection is applied to an oxidized BN source to generate $HBO_2$ which is an active boron dopant (presented by Dr. J. Stach et al at the 147th Meeting of The Electrochemical Society at Toront, Ontario, Canada on May 16, 1975). According to this proposal, since the vapor pressure of $HBO_2$ is more than 10,000 times higher at 925° C. compared to that of $B_2O_3$, the former is far superior to the latter as an active dopant. With the high vapor pressure, a high-concentration atmosphere can be obtained at the same temperature, and as a result, it is possible to diffuse boron into the silicon wafer surface uniformly in high concentration. This tendency would remain even when the temperature varies, hence diffusion is possible even at a low temperature. However, yet in the above process applying hydrogen injection, if the usual sintered BN source is used, volatile suboxides would be formed from the impurities due to the reducing component, i.e., hydrogen, thus disadvantageously accelerating the contamination of the silicon wafers.

In an effort to solve the prior art problems, the present inventors previously proposed a process of diffusing boron into semiconductor wafers by placing a multiplicity of semiconductor wafers and pyrolytic boron nitride (PBN) dopant disks in a diffusion tube kept in an inert atmosphere at a high temperature and injecting $H_2$ (Japanese Patent Laid-Open Publication No. 77118/1990). According to this process, although it is possible to remarkably improve dispersion of sheet resistivity ($\rho s$) of the silicon wafer surface and also possible to eliminate the problems resulting from metallic impurities and carbon in the sintered BN source as well as other inconveniences due to the binder for sintering, lattice defects (i.e., stacking faults) of the resulting silicon wafers would be increased.

SUMMARY OF THE INVENTION

It is therefore an object of this invention to provide a process of diffusing boron into semiconductor wafers under such an improved $H_2$ injection condition as to minimize dispersion of sheet resistivity ($\rho s$) of the silicon wafer surface and also to suppress occurrence of lattice defects (stacking faults).

According to this invention, there is provided a process of diffusing boron into semiconductor wafers, comprising: placing a multiplicity of semiconductor wafers and boron dopant disks of pyrolytic boron nitride into a diffusion tube kept in an inert atmosphere at a high temperature; and diffusing boron into the semiconductor wafers with hydrogen injection, wherein the initial concentration of $H_2$ in the diffusion tube is in a very low range of 0.05% by volume at maximum.

This very low range of the initial concentration of $H_2$ may be secured by injecting at most 12.5 cc of $H_2$ when the volume of a quartz diffusion tube is 25 liters. For example, to obtain 0.01% by volume of $H_2$ injection concentration, $H_2$ may be injected at a rate of 5 cc/minute for 30 sec. at the start of operation. If the initial concentration of $H_2$ is higher than 0.05% by volume, the boron rich layer (BRL) deposited on the silicon wafer becomes thick, thus causing crystal defects.

The boron diffusion process is generally performed as follows. Wafer-like PBN disks, each substantially identical in diameter with a semiconductor wafer, are oxidized only at their surface with oxygen or aqueous vapor. The resulting wafer-like disks and the semiconductor wafers are arranged one after another in the quartz diffusion tube and are then treated at a temperature of about 700° to 1300° C. in a mixed atmosphere of a nonoxidizing gas, such as nitrogen, argon or helium, and an oxidizing gas, such as oxygen. During this treatment a small amount of hydrogen is injected. They are subsequently treated at the same temperature but in an atmosphere of only a nonoxidizing gas, such as nitrogen, argon or helium.

In the boron diffusion process of this invention, the injected hydrogen reacts with the oxidized PBN disks to generate $HBO_2$ which is an active boron dopant. Since boron is diffused into the silicon wafer uniformly in high concentration by using $HBO_2$ of high vapor pressure, it is possible to improve the dispersion of sheet resistivity ($\rho s$) of the silicon wafer remarkably. Additionally since PBN is used as a boron source, it is possible to minimize the generation of dislocations and lattice defects, which might occur due to, for example, metallic impurities or carbon. Further, since no sintering binder is used, it is possible to eliminate any warpage or drooping of the dopant disk due to fusion of the binder contained in the sintered dopant, which would often be a problem in the known diffusion process, and it is also possible to prevent the dopant from sticking through fusion with a quartz boat holding the dopant.

Since PBN may be pure containing substantially no impurity, it is possible to minimize evaporation, precipitation and diffusion of impurities other than boron due to the reducing component, i.e., hydrogen, in the atmosphere.

Furthermore if the conventional sintered boron nitride disks are used in an atmosphere containing a reducing component such as hydrogen, the vaporized boron concentration in the atmosphere would often be unstable so that the levels of boron diffusion between batches cannot be stable. The sintered BN has grain boundaries with large gaps which will be enlarged in an atmosphere containing $H_2$ or aqueous vapor so that the effective surface area is changed batch by batch. In the conventional oxidized BN deposition system without $H_2$ or aqueous vapor, such inconveniences as described above do not occur.

The use of PBN may suppress the dispersion of sheet resistivity of the silicon wafer surface between batches to below 10%. Since PBN has a very homogeneous layer of boron nitride and has no grain boundary having a large gap, the process of this invention can be performed stably.

In diffusing boron in this invention, $H_2$ is oxidized in an oxidizing atmosphere in a diffusion furnace to produce aqueous vapor, and this vapor reacts with boron oxide, which has previously been formed on the PBN surface, resulting in the formation of volatile $HBO_2$, and then the gaseous $HBO_2$ is used for diffusing boron into the silicon wafers confronting the PBN disks. At that time, PBN disks and the silicon wafers are located facing to each other with an appropriate space in-between which is adjusted to be as small as possible to increase production efficiency. Consequently, it is significant to apply oxygen in the atmosphere to PBN during oxidation, while it is significant to apply $H_2$ to PBN during deposition process. During the oxidation process, the amount of oxygen is generally enough. In the oxidation of PBN, the surface oxidation would be the rate determining step so that application of oxygen is out of the question. On the contrary, during the deposition process, the amount of $H_2$ is very small. In the deposition process, the supply of $H_2$ to PBN would be the rate determining step so that it is critical to uniformly supply $H_2$ into the limited space between the PBN disks and the silicon wafers. This can be solved by widening the space between PBN disks and the silicon wafers adequately or by increasing the total flow of atmospheric gas.

The most significant feature of this invention is that the initial concentration of $H_2$ in the diffusion tube is in a very low range of 0.05% by volume at maximum, compared with about 0.20% by volume in the conventional process. This low initial concentration of $H_2$ lowers the concentration of $HBO_2$ generated by $H_2$ injection. The lower concentration of $HBO_2$ leads to a thinner boron rich layer (BRL) deposited on the silicon wafer. If BRL is thick, the strain layer caused by boron can not be removed even by subsequent drive-in and annealing processes, thus causing lattice defects such as stacking faults.

As described above, according to this invention, it is possible to perfectly eliminate the problems due to metallic impurities or carbon in the dopant as well as the inconveniences resulting from the presence of sintering binder, and it is also possible to improve deviation in sheet resistance ($ps$) of the silicon wafer remarkably and to suppress occurrence of lattice defects.

The above and other objects, features and advantages of the present invention will become more apparent to one skilled in the art from a reading of the following disclosure and the appended claims.

DETAILED DESCRIPTION OF THE INVENTION

Figure 1:
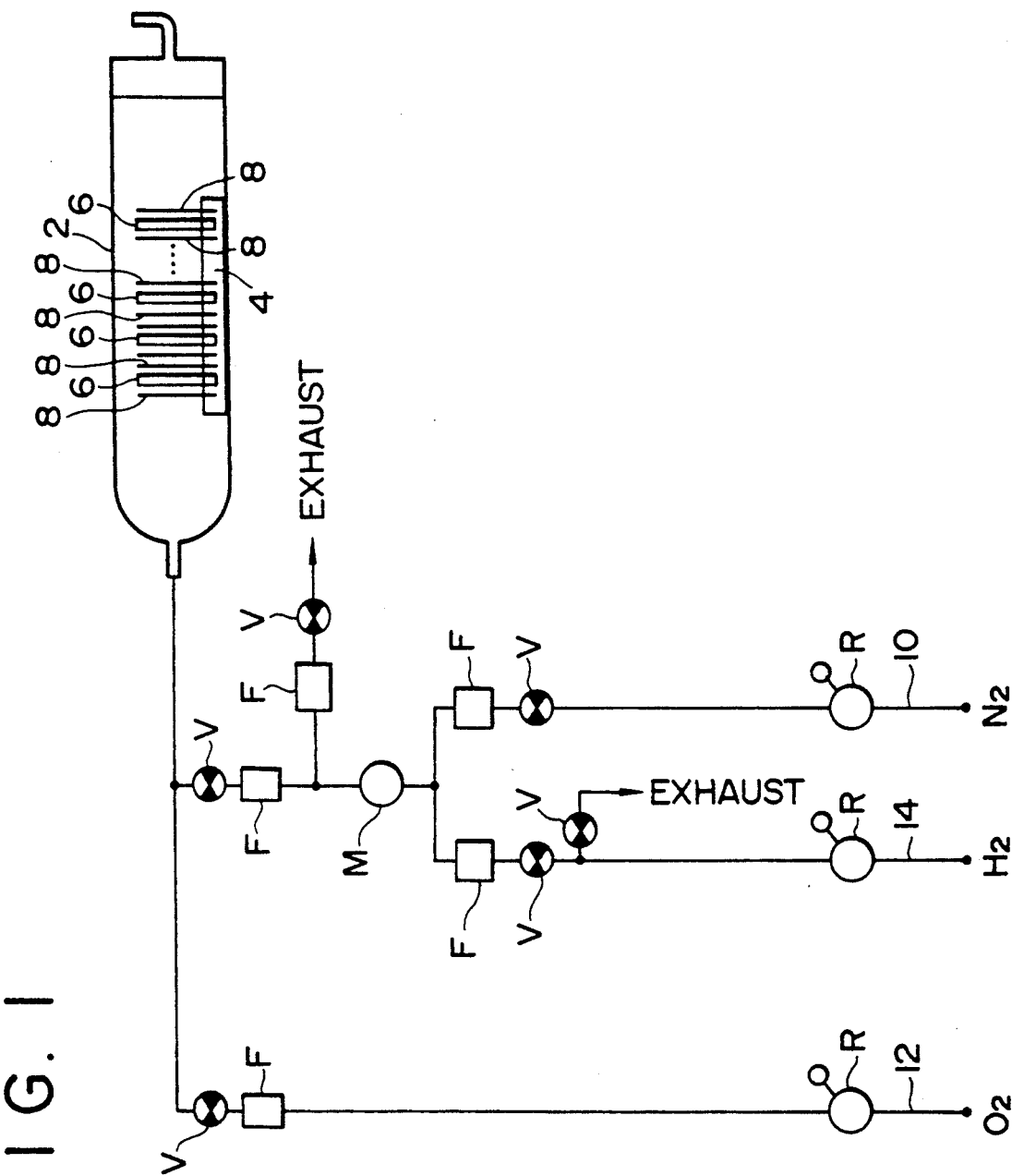
FIG. 1 is a diagrammatic illustration of an apparatus suitable for carrying out the process of Example 1.

An apparatus for carrying this process is described with reference to the accompanying drawings.

FIG. 1 shows an apparatus which can supply $N_2$, $O_2$ and $H_2$ used in Example 1 described below. In FIG. 1; reference numeral 2 designates a quartz tube as a diffusion tube; 4, a quartz boat located in the quartz tube 2; 6, PBN dopant disks disposed on the quartz boat 4; and 8, silicon wafers disposed on the quartz boat 4 and confronting the PBN dopant disks 6. R stands for a reducing valve; F, a flow meter; V, a valve; and M, a mixer. Nitrogen ($N_2$) gas, oxygen ($O_2$) gas and hydrogen ($H_2$) gas are introduced via a nitrogen gas injection pipe 10, an oxygen gas injection pipe 12 and a hydrogen gas injection pipe 14, respectively.

This invention should by no means be limited to the illustrated type of apparatus.

Examples of the practice of this invention will now be described.

EXAMPLE 1

Six nines (99.9999%) high purity boron trichloride and five nines (99.999%) high purity ammonia were subjected to vapor phase growth on high purity graphite at 2000° C. under a reduced pressure of 10 Torr to produce pyrolytic boron nitride (PBN) disks having a diameter of 100 mm and a thickness of 1.3 mm. The metallic impurities in the resulting dopant disks were below 10 ppm. After their surfaces were oxidized in an oxygen atmosphere at 1050° C., these dopant disks were set on a quartz boat alternately with 75 silicon semiconductor wafers (diameter: 100 mm; thickness: 525 $\mu$m) with a space of 5 mm from the adjacent respective wafer, and then the quartz boat was inserted in a quartz tube in a mixed atmosphere consisting of nitrogen and oxygen at a volume ratio of 1:1, and then hydrogen was injected into the quartz tube at a rate of 5 cc/minute for 30 minutes ($H_2$ concentration: 0.01% by volume) at 900° C., whereupon boron diffusion was performed at the same temperature in a nitrogen atmosphere for 40 minutes. After this diffusion, the average sheet resistance of the silicon wafers was 55 $\Omega/\square$. The sheet resistivity and the lattice defect density were measured, the results of which are shown in Table 1. It is apparent from Table 1 that the dispersion within and between the individual wafers could be suppressed to 3% at maximum and that the lattice defect density was zero pieces per $cm^2$.

EXAMPLE 2

Diffusion process was conducted under the same conditions as Example 1, except that the number of semiconductor wafers in the set was four. The sheet resistivity and the dispersion within the individual wafers were identical with those in Example 1. Also the lattice defect density was zero pieces per $cm^2$.

The results of Examples 1 and 2 show that neither the dispersion of sheet resistivity nor the lattice defects are influenced by the number of the semiconductor wafers in the set.

EXAMPLE 3

Diffusion process was conducted under the same conditions as Example 1, except that $H_2$ was injected at 0.5 cc/minute for five minutes to provide 0.01% by volume as the initial hydrogen concentration. The same results as Example 1 regarding the dispersion of sheet resistivity and the lattice defects were obtained, except that the average sheet resistivity was 59Ω/□, as shown in Table 1.

The result of Examples 1 and 3 show that the dispersion of sheet resistivity and the lattice defects depend on the initial hydrogen concentration in the diffusion furnace.

EXAMPLES 4-7 and COMPARATIVE EXAMPLES 1-2

Diffusion process was conducted under the same conditions as Example 1, except that the initial hydrogen concentration was varied in the range of 0.0033 to 0.20% by volume as the rate and time of hydrogen injection were varied commensurate with the hydrogen concentration. The dispersion of sheet resistivity and the lattice defect density were measured, the results of which are shown in Table 1.

COMPARATIVE EXAMPLE 3

Diffusion process was conducted under the same conditions as Example 1, except that hydrogen was injected at a rate of 50 cc/minute for one minute ($H_2$ concentration: 0.2% by volume). After this diffusion process, the average sheet resistivity of the silicon wafers was 59 Ω/□, the dispersion of sheet resistivity was 5.04%, and the lattice defect density was 10 to 15 pieces per $cm^2$.

thereby diffusing said boron into said wafer; the improvement which comprises limiting the initial proportion of hydrogen in said inert atmosphere to the range of 0.01–0.05% by volume, whereby reducing the number of lattice defects in said boron diffused wafer, as compared to the number of lattice defects which would exist in substantially the same wafer having boron diffused thereinto from substantially the same source under substantially the same conditions, except at a higher effective concentration of hydrogen than that present in said inert atmosphere.

2. An improved process as claimed in claim 1 wherein a multiplicity of said wafers and a multiplicity of said disks are treated simultaneously.

3. An improved process as claimed in claim 2 wherein said multiplicity of disks and wafers are alternately juxtaposed each other.

4. An improved process as claimed in claim 1 carried out at about 700° to 1300° C.

5. An improved process as claimed in claim 1 wherein said inert atmosphere comprises a non-oxidizing gas and an oxidizing gas in addition to said hydrogen.

6. An improved process as claimed in claim 5 wherein said oxidizing gas comprises oxygen.

7. An improved process as claimed in claim 5 wherein said non-oxidizing gas is at least one selected from the group consisting of nitrogen, argon and helium.

TABLE 1

| | Injection Rate (cc/min.) | Injection Time (sec.) | Initial Hydrogen Conc. (%) | Dispersion of Sheet Resistivity | Lattice Defect Density (pieces/$cm^2$) |
|---|---|---|---|---|---|
| Example 1 | 5 | 30 | 0.010 | 2.49 | 0 |
| Example 2 | 5 | 30 | 0.010 | 2.39 | 0 |
| Example 3 | 0.5 | 300 | 0.010 | 2.32 | 0 |
| Example 4 | 5 | 10 | 0.0033 | 2.47 | 0 |
| Example 5 | 5 | 20 | 0.0067 | 2.51 | 0 |
| Example 6 | 5 | 60 | 0.020 | 2.93 | 0 |
| Example 7 | 10 | 75 | 0.050 | 2.84 | 0 |
| Comparative Example 1 | 10 | 105 | 0.070 | 3.90 | 0-2 |
| Comparative Example 1 | 10 | 150 | 0.10 | 4.82 | 4-7 |
| Comparative Example 1 | 25 | 120 | 0.20 | 5.04 | 10-15 |

What is claimed is:

1. In the process of diffusing boron into a semiconductor wafer which comprises:
   at least partially oxidizing a disk of pyrolytic boron nitride to a disk comprising boron oxide;
   assembling such wafer and said oxidized disk adjacent thereto;
   subjecting said wafer and disk to conditions, including high temperature and an inert atmosphere comprising hydrogen, which are conducive to the diffusion of boron from said disk into said wafer;

8. An improved process as claimed in claim 1 including, after completing said diffusion of boron under said inert atmosphere, said wafer is further treated under a non-oxidizing atmosphere.

9. An improved process as claimed in claim 1 including the further step of at least partially reducing said oxidized disk to a composition comprising $HBO_2$.

10. An improved process as claimed in claim 1 wherein said wafer comprises semiconductive silicon.

11. An improved process as claimed in claim 1 carried out in a batch mode.

* * * * *